United States Patent
Hirose et al.

(10) Patent No.: US 6,398,978 B1
(45) Date of Patent: Jun. 4, 2002

(54) PIEZOELECTRIC CERAMIC

(75) Inventors: Masakazu Hirose; Hitoshi Oka; Takeo Tsukada, all of Chiba (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/592,733

(22) Filed: Jun. 13, 2000

(30) Foreign Application Priority Data

Jun. 21, 1999 (JP) ............................................ 11-173823

(51) Int. Cl.$^7$ ...................... C04B 35/453; H01L 41/187
(52) U.S. Cl. ................ 252/62.9 R; 501/134; 501/135; 501/136
(58) Field of Search ................ 501/134, 135, 501/136; 252/62.9 R

(56) References Cited

U.S. PATENT DOCUMENTS

| | | | |
|---|---|---|---|
| 4,900,702 A | 2/1990 | Tsuboi et al. | ................ 501/134 |
| 6,004,474 A | 12/1999 | Takenaka et al. | |
| 6,080,327 A | 6/2000 | Takenaka et al. | |
| 6,241,908 B1 * | 6/2001 | Hirose et al. | .......... 252/62.9 R |

FOREIGN PATENT DOCUMENTS

| | | |
|---|---|---|
| EP | 0 581 481 | 2/1994 |
| EP | 0 982 782 | 3/2000 |
| EP | 982782 A2 * | 3/2000 |
| JP | 9-100156 | 4/1997 |

OTHER PUBLICATIONS

ASTM Card for SrBi4Ti4O15.*
Hirose et al, "Piezoelectric Properties of SrBi4Ti4O15–Based Ceramics", Jpn. J.Appl. Phys. vol. 38, Part 1, No. 9B, pp. 5561–5563, 9/99.*
Chemical Abstract 1981:75085, date: 1981, no month.*
Ikegami et al, Piezoelectricity in Ceramics of Ferroelectric Bismuth Compound with Layer Structure, Jpn. J.Appl. Phys. vol. 13, No. 10, pp. 1572–1577, 10/74.*
Masakazu Hirose, et al., Piezoelectric Properties of $SrBi_4Ti_4O_{15}$–Based Ceramics, Jpn. J. Appl. Phys., vol. 38, Part 1, No. 9B, (Sep. 1999), pp. 5561–5563.
Derwent Publications, AN 1975–69617W, JP 50 034313, Apr. 2, 1975.
S. Ikegami, et al., Japanese Journal of Applied Physics, vol. 13, No. 10, pp. 1572–1577, "Piezoelectricity in Ceramics of Ferroelectric Bismuth Compound with Layer Structure," Oct. 1974.

* cited by examiner

Primary Examiner—C. Melissa Koslow
(74) Attorney, Agent, or Firm—Oblon, Spivak, McClelland, Maier & Neustadt, P.C.

(57) ABSTRACT

A piezoelectric ceramic is a bismuth-layer compound having $SrBi_4Ti_4O_{15}$-type crystal. The axial ratio c/a of crystal lattice is in the range of 7.46 to 7.67.

5 Claims, 1 Drawing Sheet

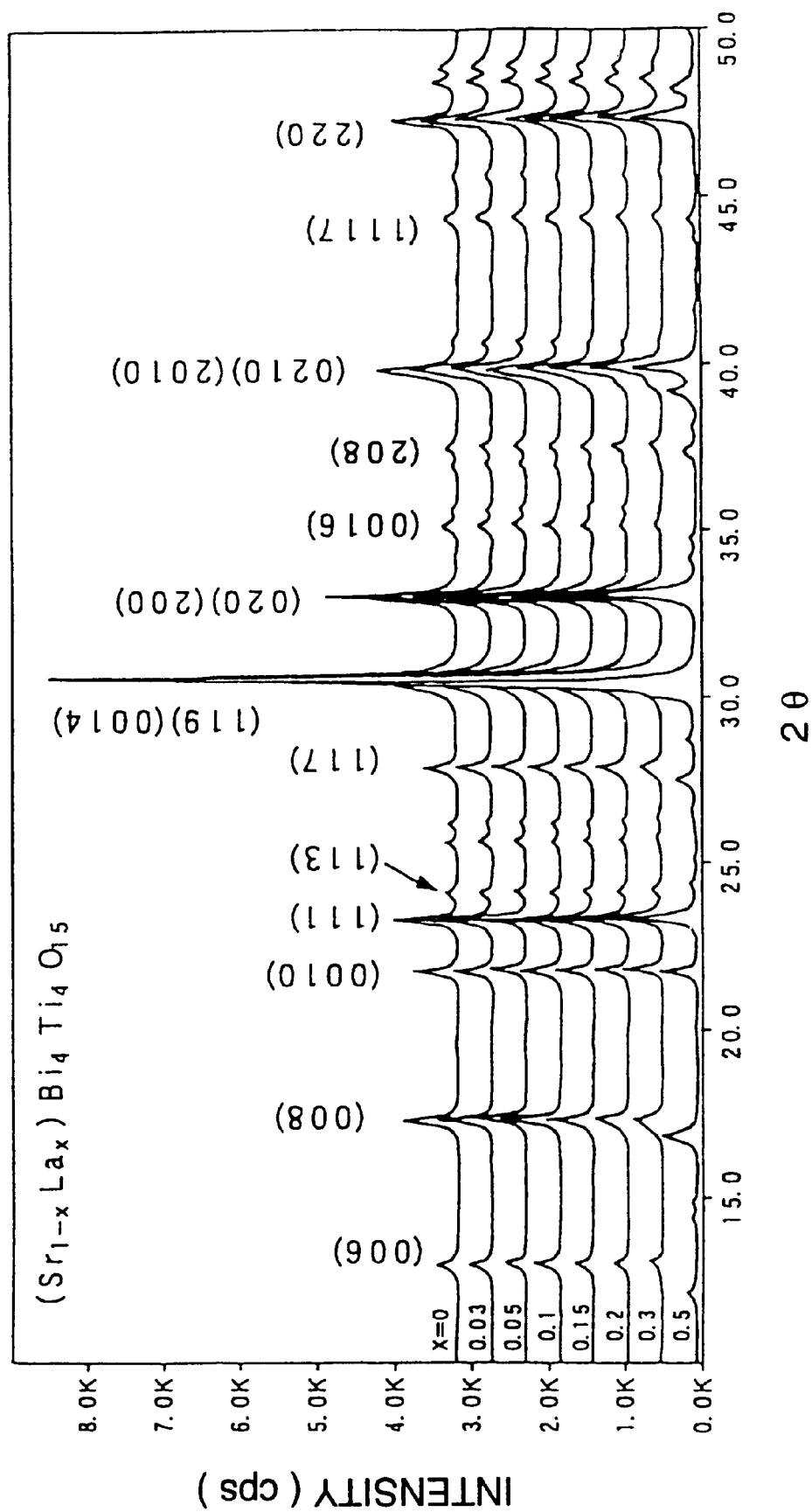
FIGURE

PIEZOELECTRIC CERAMIC

BACKGROUND OF THE INVENTION

1. Field of the Invention

The present invention relates to a piezoelectric ceramic and more particularly relates to a bismuth-layer compound which may be utilized in the field of a resonator, a high temperature sensor and the likes.

2. Description of the Related Art

The piezoelectric ceramic is widely used in the field of electronic appliance including resonator, filter and others as well as in the products including sensor or actuator in which electric charge and displacement are utilized.

The conventional piezoelectric ceramic has been generally ferroelectrics having the perovskite structure such as $PbZrO_3$—$PbTiO_3$ solid solution (called as "PZT" hereinafter) of pyromidal quadratic system or of rhombic system and $PbTiO_3$ (called as "PT" hereinafter) of pyromidal quadratic system. These materials may have various piezoelectric properties with sub-components being added thereto.

However, many of the piezoelectric ceramics of PZT group or of PT group have generally the Curie point of 200 to 400° C. and will be reduced to paraelectrics at a higher temperature and lose the piezoelectric properties. Such ceramic is, therefore, not adapted for use, for example, as an atomic reactor control sensor under a high temperature. Further the piezoelectric ceramic of PZT system or of PT system contains lead oxide (PbO) of 60 to 70 wt %. The piezoelectric ceramic is, therefore, undesirable in view of ecology as well as public pollution.

It has been desired that the piezoelectric ceramic having a property of higher Curie point and containing no lead oxide will be realized.

In response to the desire, the $(1-x)(Bi_{1/2}Na_{1/2})TiO_3$–$xNaNbO_3$ solid solution of the same perovskite structure is disclosed (JP-A-9-100156) as a piezoelectric ceramic containing no lead. The piezoelectric ceramic is, however, of the Curie point below the temperature 370° C. The piezoelectric ceramic, therefore, can not be used as a sensor for controlling the atomic reactor of higher temperature.

Further the bismuth-layer compound is known as a piezoelectric ceramic having a Curie point above the temperature 400° C. and containing no lead. The bismuth-layer compound is thermally stabilized due to the high Curie point when it is once polarization-treated and comes to have an excellent property as a high temperature-sensor. However, since the polarization itself is difficult, the polarization is liable to end in incomplete result. Thus the compound has the difficulty for obtaining a piezoelectric property which is sufficient to be used in connection with the electronic appliance.

On the other hand, in case of the resonator which is used as an inductor, the piezoelectric ceramic is required to have one of the important piezoelectric properties, that is, a large Qm (coefficient of mechanical quality) or a large Qmax (Q=maximum value of tan θ, θ:phase) between resonance frequency and anti-resonance frequency. However, there has not been such a piezoelectric ceramic of bismuth-layer compound reported to have a sufficient piezoelectric property so as to be effectively used in connection with the resonator.

SUMMARY OF THE INVENTION

The present invention has been made in view of such circumstances. It is an object of the invention to provide a piezoelectric ceramic containing no lead and having a high Curie point and excellent piezoelectric properties, especially a large Qmax.

For the purpose of attaining the object, the present invention provides a piezoelectric compound comprising a bismuth-layer compound having $SrBi_4Ti_4O_{15}$-type crystal, the axial ratio c/a of the crystal lattice being in the range of 7.49 to 7.67.

BRIEF DESCRIPTION OF THE DRAWING

In the accompanying drawing:

FIGURE is a graph showing the X-ray diffraction patterns of samples containing La and employed as the embodiment of the invention.

DETAILED DESCRIPTION OF THE DRAWINGS

The embodiment of the invention will be described herein below.

According to the present invention, the piezoelectric ceramic is a bismuth-layer compound having $SrBi_4Ti_4O_{15}$-type crystal, the axial ratio c/a of the crystal lattice being in the range of 7.49 to 7.67, preferably in the range of 7.49 to 7.54. The reason why the lower limit of axial ratio c/a is set to 7.49 is that the sintered material lower than these values has been not yet obtained. If the axial ratio c/a is more than 7.67, the compound is not desirable because the Qmax will be less than 20 and the Curie point will be lower than 450° C.

Here the way for seeking the axial ratio c/a will be described. According to the ASTM card, $SrBi_4Ti_4O_{15}$ belongs to the orthorhombic group. Precisely a-axis ≠b-axis. However, the length of a-axis and the length of b-axis are approximately equal and may be considered as pseudo-tetragonal. As will be described more in detail in connection with the embodiment, the consideration will be permitted because the actual measurement of the patterns by way of X-ray diffraction shows that the peaks (020) and (200) are in coincidence. Therefore, according to the present invention, it is construed that the length of a-axis=the length of b-axis. The lattice constant is measured by way of X-ray diffraction analysis. The length of a-axis is calculated with the peak of (200) and the length of c-axis is calculated with the peak of (008), which are respectively applied into the formula as shown below, thereby to calculate the axial ratio c/a.

$$d_{(hk1)}=a/\{h^2+k^2+1^2(a^2/c^2)\}^{1/2}$$

If the piezoelectric ceramic of the invention satisfies the numerical values in the range as mentioned above as to the axial ratio c/a of crystal lattice, it is admitted that the piezoelectric ceramic may contain at least one of the sub-components such as the lanthanoids including La, Ce, Pr, Nd, Sm, Gd, Dy, or Ho. Further the piezoelectric ceramic may contain Mn, Ba, Ca, Zr, Sn, Mo, W, Y, Zn, Sb, Si, Nb, or Ta as the impurities or very small quantity of additives. In this case, it is preferable that the quantity contained is below 1 wt % in terms of oxides of these components.

The piezoelectric ceramic of the present invention is a bismuth-layer compound having $SrBi_4Ti_4O_{15}$-type crystal. If the numerical values are in the range as to the axial ratio c/a of crystal lattice, the ratio of Sr to Ti or the ratio of sub-components such as the lanthanoids+Sr or Bi to Ti may be out of the composition defined by the stoichiometric theory. Further the oxygen content may vary in accordance with the valence number of metal elements, or the oxygen defects.

The crystal article of piezoelectric ceramic according to the present invention is spindle-shaped and/or acicular-shaped and the average particle size is not specifically defined. The average particle size is, for example, 1 to 10 $\mu$m in the longitudinal direction, and preferably 3 to 5 $\mu$m.

The piezoelectric ceramic of the present invention has a high Curie point above 450° C. and has a Qmax larger than 20. The piezoelectric ceramic is, therefore, adapted for use in connection with the resonator, or the high temperature-sensor. Further since the piezoelectric ceramic contains no lead, it is harmless to the environment.

Subsequently the method for producing the piezoelectric ceramic is described by way of example.

At first, a starting material, an oxide or a compound changeable into an oxide by calcination, for example, carbonate, hydroxide, oxalate, nitrate or the like, actually the powder of oxide of the lanthanoids including $SrCO_3$, $Bi_2O_3$, $TiO_2$, $La_2O_3$ or the like is wet-mixed in the ball mill or the like.

The mixture is dried. Subsequently the mixture is calcined for 1 to 3 hours at the temperature of 750 to 1000° C. Subsequently the calcined mixture is rendered into slurry and is wet-crushed in the ball mill or the like. The crushed mixture is dried, and then is added with a binder such as polyvinyl alcohol (PVA) as the occasion demands, and then is processed into particles. Subsequently the particles are press-molded (weighting 2000 to 3000 kgf/cm$^2$) to obtain molded pieces.

Subsequently the molded pieces are actually sintered for 2 to 4 hours at the temperature of 1150 to 1300° C. Then the molded pieces are polarization-treated (electric field of 5 to 15 MV/mm applied for 1 to 10 minutes) in a silicon oil bath of the temperature 150 to 300° C., thereby to obtain piezo-electric ceramics. The actual sintering may take place in an open air or in an atmosphere wherein the partial pressure of oxygen is higher or lower than the open air or in an oxygen atmosphere. In case the binder such as PVA or the like is used, it is preferable that the molded pieces are heat-treated to burn out the binder before the molded pieces are sintered.

EXAMPLES

The present invention will be described by way of an example which will, however, give no limitation to the present invention in any way.

As a starting material, each powder of $Bi_2O_3$, $TiO_2$, $SrCO_3$, $La_2O_3$, $Sm_2O_3$, $Gd_2O_3$, $Pr_6O_{11}$, $Dy_2O_3$, $Ho_2O_3$, $Er_2O_3$, $CeO_2$, and $MnCO_3$ was prepared. The quantity of each powder was measured so as to form up the compositions as shown in Table 1 as shown below. Each of the compositions was mixed (for about 15 hours) in pure water in the ball mill by use of zirconia balls.

Each of the mixtures thus obtained was completely dried and press-molded and then calcined for 2 hours at the temperature 750 to 900° C. Subsequently each of the calcined pieces was wet-crushed in the ball mill and was dried and was then added with a proper quantity of polyvinyl alcohol (PVA) and processed into particles.

Subsequently the powder thus obtained is molded into a thin plate which is 20 mm length×20 mm width×and 1.5 mm thickness with the weight 2000 to 3000 kgf/cm$^2$ added by use of a single-shaft press molding machine.

Subsequently the molded plate was heat-treated to burn out the binder and was then actually sintered (in atmosphere) for 2 to 4 hours at the temperature 1150 to 1300° C., thereby to obtain a sintered plate. Subsequently the sintered plate was ground until it becomes a parallel plate with about 0.5 mm thickness of and is then cut to become 6 mm length and 6 mm width and was then formed with silver electrodes on the opposite sides thereof by way of vacuum-evaporation. Subsequently the plate thus formed was polarization-treated with the electric field of 5 to 15 MV/mm applied thereto for 1 to 10 minutes in a silicon oil bath of the temperature 150 to 300° C. Thus the samples 1 to 31 of piezoelectric ceramic were obtained.

As to each of the samples thus produced, the lattice constant, the axial ratio c/a, Qmax and Qm (mechanical quality coefficient) were measured. The measured results are shown in Table 1 as shown below. FIG. 1 shows the X-ray diffraction patterns of No.1 to 8 samples $(Sr_{1-x}La_x)Bi_4Ti_4O_{15}$ ($0 \leq x \leq 0.5$) containing La as a sub-component.

Method for Measuring Lattice Constant and Axial Ratio c/a

Each sample was finely crushed in an agate mortar and the lattice constant was measured by way of the X-ray diffraction analysis. The length of a-axis was calculated with the peak (200) and the length of c-axis was calculated with the peak (008), which were respectively applied to the formula as shown below, thereby to calculate the axial ratio c/a.

$$d_{(hk1)} = a/\{h^2 + k^2 + 1^2(a^2/c^2)\}^{1/2}$$

Method for Measuring Qmax

This was measured by use of the Impedance Analyzer HP4914A provided by Hewlett Packard Corporation. Qmax represents a maximum value of Q (=tan $\theta$, $\theta$:phase) between resonance frequency and anti-resonance frequency and contributes to low voltage oscillation as a resonator and is required to be larger than 20.

Method for Measuring Qm

This was measured by use of the Impedance Analyzer HP4914A provided by Hewlett Packard Corporation.

TABLE 1

| Piezoelectric ceramic sample No. | Composition | | | | | additives | | Grating constant | | | Qmax | Qm |
|---|---|---|---|---|---|---|---|---|---|---|---|---|
| | Sr (mol) | Substitution material | Substitution amount (mol) | Bi (mol) | Ti (mol) | Kind | Amount (Wt %) | a = b (Å) | c (Å) | Aix ratio c/a | | |
| 1 | 1 | — | — | 4 | 4 | — | — | 5.430 | 40.74 | 7.502 | 32.5 | 932 |
| 2 | 0.97 | La | 0.03 | 4 | 4 | — | — | 5.427 | 40.72 | 7.502 | 29.6 | 2013 |
| 3 | 0.95 | La | 0.05 | 4 | 4 | — | — | 5.419 | 40.62 | 7.496 | 33.8 | 4323 |
| 4 | 0.9 | La | 0.1 | 4 | 4 | — | — | 5.420 | 40.76 | 7.508 | 38.5 | 6721 |
| 5 | 0.85 | La | 0.15 | 4 | 4 | — | — | 5.421 | 40.74 | 7.515 | 31.0 | 1889 |
| 6 | 0.8 | La | 0.2 | 4 | 4 | — | — | 5.419 | 40.69 | 7.509 | 21.0 | 932 |

TABLE 1-continued

| Piezoelectric ceramic sample No. | Composition | | | | | | | Grating constant | | | Qmax | Qm |
| --- | --- | --- | --- | --- | --- | --- | --- | --- | --- | --- | --- | --- |
| | Sr (mol) | Substitution | | Bi (mol) | Ti (mol) | additives | | | | Aix ratio c/a | | |
| | | Substitution material | amount (mol) | | | Kind | Amount (Wt %) | a = b (Å) | c (Å) | | | |
| 7 | 0.7 | La | 0.3 | 4 | 4 | — | — | 5.410 | 40.76 | 7.535 | 23.8 | 2115 |
| 8* | 0.5 | La | 0.5 | 4 | 4 | — | — | 5.418 | 41.96 | 7.745 | 3.6 | 494 |
| 9 | 0.9 | La | 0.1 | 4 | 4 | $MnCO_3$ | 0.01 | 5.429 | 40.74 | 7.504 | 24.0 | 2747 |
| 10 | 0.9 | La | 0.1 | 4 | 4 | $MnCO_3$ | 0.03 | 5.429 | 40.76 | 7.508 | 31.5 | 2993 |
| 11 | 0.9 | La | 0.1 | 4 | 4 | $MnCO_3$ | 0.1 | 5.419 | 40.67 | 7.505 | 40.3 | 1597 |
| 12 | 0.9 | La | 0.1 | 4 | 4 | $MnCO_3$ | 0.5 | 5.423 | 40.69 | 7.504 | 62.7 | 3388 |
| 13 | 0.9 | La | 0.1 | 4 | 4 | $MnCO_3$ | 0.7 | 5.432 | 40.85 | 7.521 | 69.6 | 2003 |
| 14 | 0.95 | La | 0.05 | 4 | 4 | $MnCO_3$ | 0.5 | 5.435 | 40.85 | 7.516 | 48.9 | 2552 |
| 15 | 0.85 | La | 0.15 | 4 | 4 | $MnCO_3$ | 0.5 | 5.428 | 40.78 | 7.513 | 62.6 | 3636 |
| 16 | 0.9 | Ce | 0.1 | 4 | 4 | $MnCO_3$ | 0.5 | 5.440 | 40.97 | 7.531 | 63.6 | 4214 |
| 17 | 0.9 | Pr | 0.1 | 4 | 4 | $MnCO_3$ | 0.5 | 5.429 | 40.79 | 7.513 | 56.6 | 3896 |
| 18 | 0.9 | Sm | 0.1 | 4 | 4 | — | — | 5.426 | 40.76 | 7.512 | 30.2 | 2854 |
| 19 | 0.8 | Sm | 0.2 | 4 | 4 | — | — | 5.416 | 40.79 | 7.530 | 30.0 | 6034 |
| 20 | 0.7 | Sm | 0.3 | 4 | 4 | — | — | 5.421 | 41.54 | 7.664 | 20.4 | 2173 |
| 21* | 0.6 | Sm | 0.4 | 4 | 4 | — | — | 5.419 | 42.03 | 7.756 | 9.6 | 2069 |
| 22 | 0.9 | Sm | 0.1 | 4 | 4 | $MnCO_3$ | 0.5 | 5.438 | 40.99 | 7.538 | 52.1 | 3305 |
| 23 | 0.9 | Gd | 0.1 | 4 | 4 | — | — | 5.423 | 40.72 | 7.508 | 34.7 | 3905 |
| 24* | 0.7 | Gd | 0.3 | 4 | 4 | — | — | 5.408 | 41.69 | 7.708 | 6.5 | 535 |
| 25 | 0.9 | Gd | 0.1 | 4 | 4 | $MnCO_3$ | 0.5 | 5.424 | 40.80 | 7.523 | 61.5 | 4462 |
| 26 | 0.9 | Dy | 0.1 | 4 | 4 | — | — | 5.432 | 40.97 | 7.543 | 35.6 | 6164 |
| 27 | 0.9 | Dy | 0.1 | 4 | 4 | $MnCO_3$ | 0.5 | 5.424 | 40.83 | 7.528 | 55.8 | 4865 |
| 28 | 0.9 | Ho | 0.1 | 4 | 4 | — | — | 5.429 | 40.90 | 7.534 | 31.2 | 3933 |
| 29 | 0.9 | Ho | 0.1 | 4 | 4 | $MnCO_3$ | 0.5 | 5.424 | 40.81 | 7.523 | 53.1 | 7794 |
| 30 | 0.9 | er | 0.1 | 4 | 4 | — | — | 5.423 | 40.81 | 7.526 | 36.8 | 1528 |
| 31 | 0.9 | Er | 0.1 | 4 | 4 | $MnCO_3$ | 0.5 | 5.433 | 40.92 | 7.532 | 44.8 | 8352 |

*indicates a comparative example.

As shown by Table 1, the piezoelectric ceramic having $SrBi_4Ti_4O_{15}$-type crystal, the axial ratio c/a of crystal lattice being in the range of 7.49 to 7.67, has been confirmed to have a Qmax which is larger than 20, irrespective of the type of sub-component (lanthanoids) and/or irrespective of existence or non-existence of a very small quantity of additive (Mn).

Further as shown in FIG. 1, the (008) peak of X-ray diffraction pattern represents a new peak in case the substitution quantity of the sub-component La is x=0.3, and the peak completely shifts to the lower angle side in case the substitution quantity is x=0.5. Such a shift of (008) peak is in agreement with the decrease of piezoelectric property which is due to the fact that the axial ration c/a shown in Table 1 exceeds 7.67.

According to the invention, the piezoelectric ceramic is a bismuth-layer compound having $SrBi_4Ti_4O_{15}$-type crystal, the axial ratio c/a of crystal lattice being in the range of 7.49 to 7.67. The piezoelectric ceramic is excellent in piezoelectric property because it contains no lead and has a Curie point higher than the temperature 450° C. and further has a Qmax larger than 20.

What is claimed is:

1. A piezoelectric ceramic, comprising a bismuth-layer compound having $SrBi_4Ti_4O_{15}$-type crystal, wherein an axial ratio c/a of a crystal lattice is in the range of 7.49 to 7.67, wherein the compound has the following formula:

$(Sr_{1-x}Ln_x)Bi_4Ti_4O_{15}(0<x \leq 0.5)$, wherein Ln is a lanthanoid element,
wherein Qmax is 20 or more and Curie point is 450° C. or more.

2. The piezoelectric ceramic according to claim 1, wherein the axial ratio c/a of the crystal lattice is in the range of 7.49 to 7.54.

3. The piezoelectric ceramic according to claim 1, wherein a crystal particle of the piezoelectric ceramic is spindle-shaped and/or acicular-shaped.

4. The piezoelectric ceramic according to claim 3, wherein an average particle size of the crystal particle is in the range of 1 to 10 μm.

5. The piezoelectric ceramic according to claim 4, wherein an average particle size of the crystal particle is in the range of 3 to 5 μm.

* * * * *